United States Patent
Lan et al.

(10) Patent No.: US 10,217,500 B1
(45) Date of Patent: Feb. 26, 2019

(54) INDUCTIVE SPIN-ORBIT TORQUE DEVICE AND METHOD FOR FABRICATING THE SAME

(71) Applicant: NATIONAL APPLIED RESEARCH LABORATORIES, Taipei (TW)

(72) Inventors: Yann-Wen Lan, Hsinchu (TW); Qiming Shao, Los Angeles, CA (US); Guoqiang Yu, Los Angeles, CA (US); Kang-Lung Wang, Santa Monica, CA (US); Wen-Kuan Yeh, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 0 days.

(21) Appl. No.: 15/722,118

(22) Filed: Oct. 2, 2017

(51) Int. Cl.
| | |
|---|---|
| *G11C 11/00* | (2006.01) |
| *G11C 11/16* | (2006.01) |
| *G11C 11/14* | (2006.01) |
| *G11C 11/56* | (2006.01) |
| *C23C 16/06* | (2006.01) |
| *C23C 14/34* | (2006.01) |

(52) U.S. Cl.
CPC ............ *G11C 11/161* (2013.01); *G11C 11/14* (2013.01); *G11C 11/5607* (2013.01); *C23C 14/34* (2013.01); *C23C 16/06* (2013.01)

(58) Field of Classification Search
CPC .................................................. G11C 11/161
USPC .......................................................... 365/158
See application file for complete search history.

(56) References Cited

U.S. PATENT DOCUMENTS

2015/0108431 A1* 4/2015 Kim ...................... H01L 31/032
257/21

OTHER PUBLICATIONS

Qiming Shao, Guoqiang Yu, Yann-Wen Lan, Yumeng Shi, Ming-Yang Li, Cheng Zheng, Xiaodan Zhu, Lain-Jong Li, Pedram Khalili Amiri, and Kang L. Wang; "Strong Rashba-Edelstein Effect-Induced Spin-Orbit Torques in Monolayer Transition Metal Dichalcogenide/Ferromagnet Bilayers", 2016 American Chemical Society, Nano Lett. 2016, 16, 7514-7520.

* cited by examiner

*Primary Examiner* — Hoai V Ho
(74) *Attorney, Agent, or Firm* — Rosenberg, Klein & Lee

(57) ABSTRACT

The present invention relates to an inductive spin-orbit torque device and the method for fabricating the same. The method comprises steps of depositing a two-dimensional thin film using chemical vapor deposition (CVD) and sputtering a ferromagnetic material on the thin film. The crystal structure of the two-dimensional thin film includes at least one lattice plane arranged asymmetrically. The thickness of the two-dimensional thin film includes at least one unit-cell layer. The sum of the at least one unit-cell layer is an odd number. By using the vertical magnetic torque generated by the two-dimensional thin film and the miniaturization in thickness, the device size and the fabrication costs may be reduced.

9 Claims, 5 Drawing Sheets

INDUCTIVE SPIN-ORBIT TORQUE DEVICE AND METHOD FOR FABRICATING THE SAME

FIELD OF THE INVENTION

The present invention relates generally to a torque device and the method for fabricating the same, and particular to an inductive spin-orbit torque device and the method for fabricating the same.

BACKGROUND OF THE INVENTION

Currently, popular memories include the static random-access memory (SRAM) and the dynamic random-access memory (DRAM). The advantage of the former is its fast speed while the advantage of the latter is its high density. Nonetheless, these two types of memories are mainly formed by transistors, which feature large sizes, compromising advantages, and volatility. Advanced memories mainly control the magnetism of materials to produce 0 and 1 states. They can be made of nonvolatile memory materials and own the merits of high speed and small size.

Spintronics devices are developing prosperously. In the past, magnetic moments are arranged on a plane and used as the sensing mechanism. Unfortunately, to produce significant flipping in magnetic vectors, the adopted materials should have a certain thickness, making them inappropriate for mass production. Electron spins mean that the angular momenta of electrons behave classically and act on electron orbits along with torques.

To make the magnetic memory devices according to the prior state of art with significant magnetization due to normal orientation of magnetic moments along the plane of materials, the thickness of magnetic materials should be increased, and two materials should be assembled by attachment. Nonetheless, this method increases the volume of memories, disfavoring mass production.

SUMMARY

An objective of the present invention is to provide an inductive spin-orbit torque device and the method for fabricating the same. The inductive spin-orbit torque device owns the spin torque property of inducible materials.

Another objective of the present invention is to provide an inductive spin-orbit torque memory, which owns the properties of miniature volume and low fabrication costs, and hence suitable for mass production.

Another objective of this invention is to achieve miniature volume over and above lower fabrication cost comparing to the currently existing memories in our devices. Once the superiorities are established, our brainchild is suitable for mass production.

In order to accomplish the above objectives and efficacies, the present invention provides an inductive spin-orbit torque device and the method for fabricating the same. The inductive spin-orbit torque device comprises a two-dimensional thin film and a ferromagnetic material layer. The crystal structure of the two-dimensional thin film includes at least one lattice plane arranged asymmetrically.

According to an embodiment, the method for fabricating the inductive spin-orbit torque device comprises steps forming a transition metal dichalcogenide layer on a sapphire using CVD in the first chamber. By transferring to a the second chamber via a load lock, ferromagnetic material layer in a first direction is deposited on the two-dimensional material layer via sputter system in the second chamber.

According to the inductive spin-orbit torque device and the method for fabricating the same disclosed in the present invention, the thickness of memory devices may be reduced. Moreover, large-area device may be formed at one time. Thereby, the costs for subsequent processes for memory devices may be saved.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
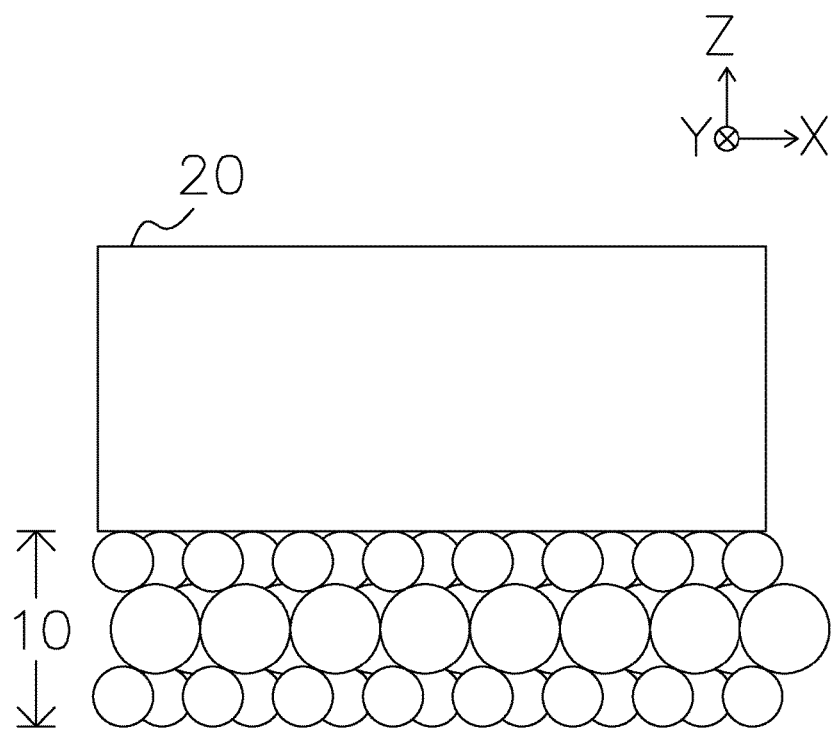
FIG. 1 shows a schematic diagram according to an embodiment of the present invention.

Please refer to FIG. 1, which shows a schematic diagram according to an embodiment of the present invention. As shown in the figure, the inductive spin-orbit torque device according to the present invention comprises a two-dimensional thin film 10 and a ferromagnetic material layer 20. The vertical direction to the plane of the two-dimensional thin film 10 is a first direction Z. The ferromagnetic material layer 20 is disposed along the first direction Z of the thin film 10. A second direction X and a third direction Y of the two-dimensional thin film 10 are parallel with the plane of the two-dimensional thin film 10.

Figure 2A:
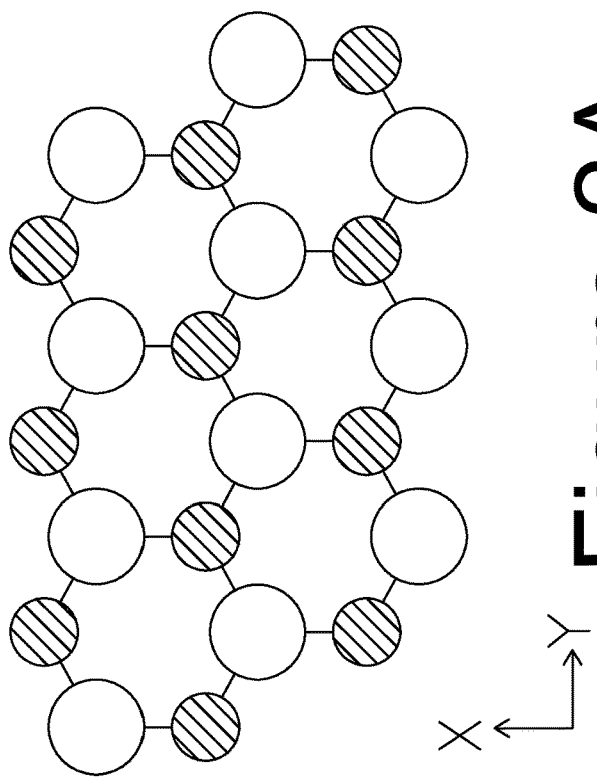
FIG. 2A shows a top view of the two-dimensional thin film crystal structure according to the present invention.
Figure 2B:
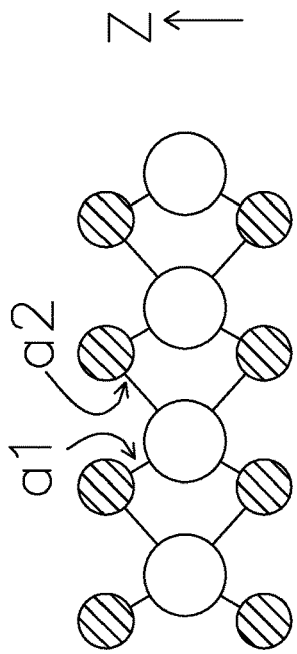
FIG. 2B shows a side view of the two-dimensional thin film crystal structure according to the present invention.

Please refer to FIG. 2A and FIG. 2B, which show top and side views of the two-dimensional thin film crystal structure according to the present invention. As shown in the figures, the lattice plane of the crystal structure of the two-dimensional thin film 10 is arranged asymmetrically. The so-called crystal structure refers to periodically extended arrangement of a unit cell of the thin film. The so-called lattice plane is the crystal plane indicated by the Miller index. Besides, the so-called asymmetric arrangement means the asymmetric structure of atomic arrangement (as shown in FIG. 2B, the lengths and locations of the bonds a1 and a2 are different, making the overall structure asymmetric). Furthermore, in addition to material properties, the manipulation of electron spin is closely related to the crystal structure of materials as well. If the structure is symmetric, electron spins interfere with one another and thus diminishing the effect of torque. The thickness of the two-dimensional thin film 10 according to the present invention is formed by odd layers of unit cells. That is to say, the crystal structure of the two-dimension thin film 10 along the first direction Z may include 1, 3, 5 . . . layers of unit cells for avoiding symmetry occurred when the thickness of thin film includes even layers, which will diminish the effect of spin-orbit torque. It should be noted that, for easier understanding, the coordinates illustrated here are Cartesian coordinates X, Y, and Z. Nonetheless, they are not limited to the direction of the lattice plane of the asymmetric arrangement for the crystal structure. Instead, the lattice plane should be the one represented by the Miller index.

According to the present invention, at least one lattice plane of the two-dimensional thin film 10 is arranged asymmetrically. The two-dimensional thin film 10 has vertical magnetic moments on the surface for operating with the ferromagnetic material layer 20. When a current passes through the device, it induces the effect of spin-orbit torque and thus altering the magnetoresistance of the device. Thereby, the device acts as a memory device.

The ferromagnetic material layer 20 is formed by cobalt iron boron (CoFeB) featuring superior vertical magnetization. In addition, the miniaturization of electronic devices appeals gradual attention on two-dimensional materials. Normal two-dimensional materials include transition metal dichalcogenides (TMDs), which own a crystal structure of single atomic layer like graphene and feature vertical magnetic moments. Thereby, TMDs are one of important materials for the electronic miniaturization technology. TMDs are multinary compounds expressed as MX, where M is a Group 4, 5, or 6 element whereas X is a chalcogenide element. The thin film material according to the present invention is a TMD featuring spin-orbit coupling, such as molybdenum sulfides (MoS, MoSSe), tungsten sulfides (WS, WSSe), molybdenum disulfide ($MoS_2$), tungsten disulfide ($WS_2$), tungsten diselenide ($WSe_2$), or multinary compounds formed by MX combinations. Because the atomic arrangement of the crystal structure of such TMDs is nearly planar, it is essentially equivalent to using a unit cell. This contributes to achieving the effect of inducing spin-orbit torque as well as lowering fabrication costs by device miniaturization.

Figure 3:
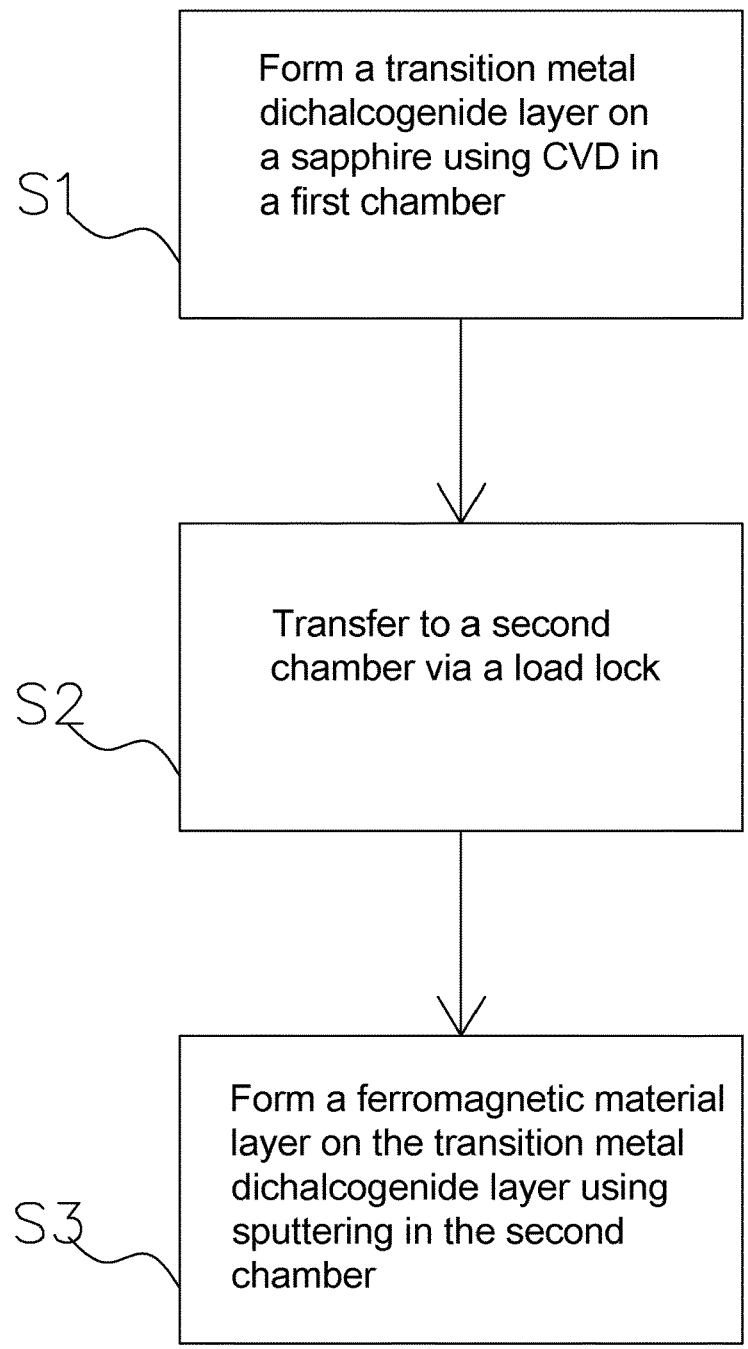
FIG. 3 shows a process flowchart for the inductive spin-orbit torque device according to the present invention.

Please refer to FIG. 3, which shows a process flowchart for the inductive spin-orbit torque device according to the present invention. As shown in the figure, the method comprises the following steps. In the step S1, form a transition metal dichalcogenide layer on a sapphire using CVD in a first chamber. In the step S2, transfer to a second chamber via a load lock. In the step S3, form a ferromagnetic material layer on the transition metal dichalcogenide layer using sputtering in the second chamber.

Figure 4:
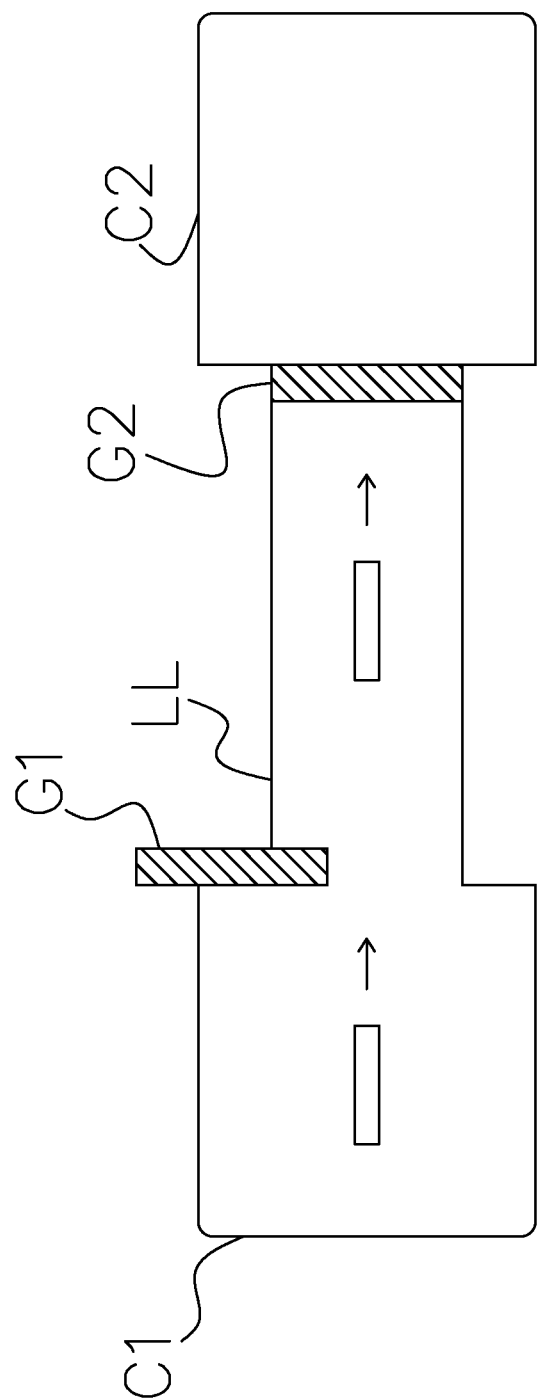
FIG. 4 shows a schematic diagram of the first chamber C1, the load lock LL, and the second chamber C2 according to the present invention.

Please refer to FIG. 4, which shows a schematic diagram of the first chamber C1, the load lock LL, and the second chamber C2 according to the present invention. As shown in the figure, the first chamber C1, the load lock LL, and the second chamber C2 include a first gate G1 and a second gate G2 therebetween, respectively. In the first chamber C1, CVD is utilized for depositing the TMD layer. Then, regulate the pressure of the load lock LL. After the pressure of the load lock LL is identical to that of the first chamber C1, the first gate G1 is opened and the device is transferred to the load lock LL. Next, the first gate G1 is closed and regulate the pressure of the second chamber C2. After the pressure of the second chamber C2 is identical to that of the load lock LL, the second gate G2 is opened and the device is transferred to the second chamber C2 for performing the subsequent sputtering.

By using CVD, large-area two-dimensional materials may be formed and hence reducing the fabrication costs for memory devices. Because the defects at the interface of materials affect the effect of electron spin, according to the fabrication process of the present invention, the device is kept away from air by taking advantage of the pressure difference in the buffering process step of the load lock LL. Thereby, defects at the interface between the two-dimensional material and the ferromagnetic material may be reduced, and hence the influence of defects on the effect of spin-orbit torque may be minimized.

Figure 5:
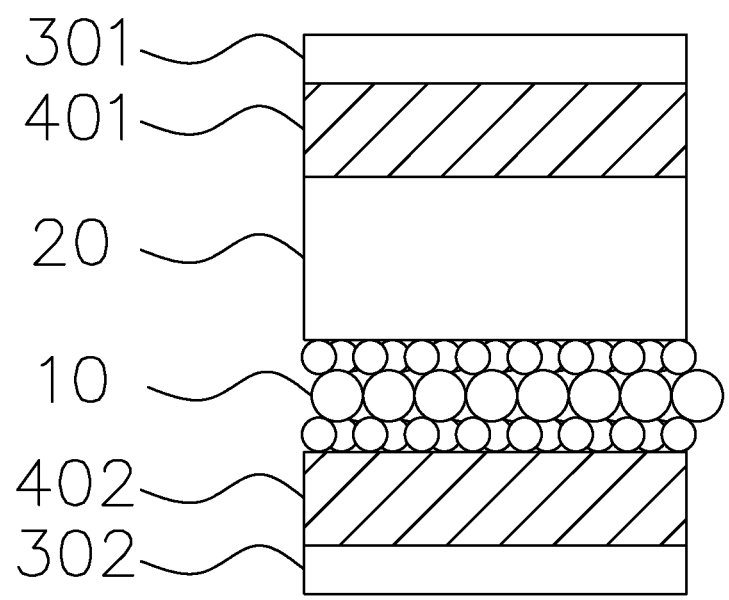
FIG. 5 shows a schematic diagram of the spin-orbit memory according to an embodiment of the present invention.

Please refer to FIG. 5, which shows a schematic diagram of the spin-orbit memory according to an embodiment of the present invention. As shown in the figure, in addition to the two-dimensional thin film 10 and the ferromagnetic material layer 20 as described above, the inductive spin-orbit torque device according to the present invention further comprises a first electrode 301, a first oxide layer 401, a second electrode 302, and a second oxide layer 402. The two-dimensional thin film 10 and the ferromagnetic material layer 20 are sandwiched between the first electrode 301, the first oxide layer 401, the second electrode 302, and the second oxide layer 402. The first and second electrodes 301, 302 are coupled to the voltage to produce current. The effect of spin-orbit torque occurs at the interface between the two-dimensional thin film 10 and the ferromagnetic material layer 20. By sensing the variation of the magnetoresistance, the state 0 or 1 of the memory device may be judged. Compared to the prior art, the thickness of the two-dimensional thin film 10 is in atomic level and may be as low as a single unit-cell layer. Thereby, the thickness of memories may be reduced significantly. In addition, the two-dimensional thin film 10 may be fabricated in a large area and be cut. Compared to the attachment method according to the prior art, the fabrication costs for the spin-orbit torque memory according to the present invention is obviously lowered.

The present invention provides an inductive spin-orbit torque device and the method for fabricating the same. The method comprises steps of depositing a two-dimensional thin film using CVD and sputtering a ferromagnetic material on the thin film. The crystal structure of the two-dimensional thin film includes at least one lattice plane arranged asymmetrically. The thickness of the two-dimensional thin film includes odd layers of unit cells and preferably a single unit cell for reducing the device thickness. By using the above structure and fabrication method, a large-area thin film may be formed at one time before patterning to form memory devices. Hence, the fabrication costs may be reduced.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:
1. A spin-orbit torque memory, comprising:
a first electrode;
a first oxide layer, disposed on the first electrode;
a two-dimensional thin film, disposed on the first oxide layer;
a ferromagnetic material layer, disposed on the two-dimensional thin film;
a second oxide layer, disposed on the ferromagnetic material layer; and
a second electrode, disposed on the second oxide;
wherein the crystal structure of the two-dimensional thin film includes at least one lattice plane arranged asymmetrically; and the thickness of the two-dimensional thin film includes the thickness of the at least one unit-cell layer.

2. The spin-orbit torque memory of claim 1, wherein the amount of the at least one unit-cell layer is an odd number.

3. The spin-orbit torque memory of claim 1, wherein the two-dimensional thin film further includes two lattice planes in asymmetric lattice.

4. The spin-orbit torque memory of claim 1, wherein the two-dimensional thin film has vertical magnetic moments on the surface for operating with the ferromagnetic material layer.

5. The spin-orbit torque memory of claim 1, wherein the material of the two-dimensional thin film is selected from the group consisting of transition-metal dichalcogenides featuring spin-orbit coupling.

6. The spin-orbit torque memory of claim 1, wherein a direction perpendicular to the plane of the two-dimensional thin film is a first direction of the two-dimensional thin film; the ferromagnetic material layer is disposed along the first direction of the two-dimensional thin film; and a second direction and a third direction of the two-dimensional thin film are parallel to the plane of the two-dimensional thin film.

7. The spin-orbit torque memory of claim 1, wherein the ferromagnetic material layer is cobalt iron boron.

8. The spin-orbit torque memory of claim 1, wherein the crystal plane of the two-dimensional thin film is indicated by the Miller index.

9. The spin-orbit torque memory of claim 1, wherein the crystal structure of the two-dimensional thin is a crystal structure of single atomic layer.

* * * * *